United States Patent [19]

Seo

[11] Patent Number: 6,104,637
[45] Date of Patent: Aug. 15, 2000

[54] APPARATUS FOR PROGRAMMING THRESHOLD VOLTAGE FOR NON-VOLATILE MEMORY CELL AND METHOD THEREFOR

[75] Inventor: Seok-Ho Seo, Cheongju, Rep. of Korea

[73] Assignee: Hyundai Micro Electronics Co., Ltd., Cheongju, Rep. of Korea

[21] Appl. No.: 09/396,207

[22] Filed: Sep. 15, 1999

[30] Foreign Application Priority Data

Sep. 17, 1998 [KR] Rep. of Korea ............... 98-38440

[51] Int. Cl.[7] .................................................. G11C 16/04
[52] U.S. Cl. .......................... 365/185.24; 365/185.2; 365/185.23; 365/189.05
[58] Field of Search .................... 365/185.24, 185.23, 365/185.2, 189.05, 210, 189.07

[56] References Cited

U.S. PATENT DOCUMENTS

| | | | |
|---|---|---|---|
| 5,654,918 | 8/1997 | Hammick | 365/185.24 |
| 5,818,759 | 10/1998 | Kobayashi | 365/285.2 |
| 5,998,831 | 12/1999 | Kodama et al. | 365/185.24 |
| 6,021,068 | 2/2000 | Miki et al. | 365/185.2 |

*Primary Examiner*—Son T. Dinh
*Attorney, Agent, or Firm*—Fleshner & Kim, LLP

[57] ABSTRACT

An apparatus for programming a threshold-voltage of a non-volatile memory cell includes a reference voltage generator means applying a predetermined voltage to a word line of a reference memory cell having the same electric characteristics as the memory cell desired to be programmed and generating a reference voltage by thusly generated current; a comparator means comparing the reference voltage with a bit line voltage according to the cell current flowing at the memory cell to be programmed; a word line voltage generator means being controlled by a level count value, selecting word line voltages corresponding to the plurality of threshold voltages of the memory cell to be programmed and outputting it; a word line driving means applying the word line voltages selected by the word line voltage generator means to the word line selected by the word line enable signal; a level data selector means encoding a state data and selectively outputting data corresponding to each level by the level select signal; a latch means being controlled by the output signal from the comparator, latching the data outputted from the level data selector means; a bit line voltage controller means selectively discontinuing programming according to the level of the data latched by the latch means; and a bit line selector means selecting a specific bit line by a bit line enable signal

19 Claims, 6 Drawing Sheets

| STATE DATA | THRESHOLD VOLTAGE | LEVEL | OUTPUT DATA |
|---|---|---|---|
| 0 0 | VTH3 | LEVEL3 | 0 0 0 0 |
| 0 1 | VTH2 | LEVEL2 | 1 0 0 0 |
| 1 0 | VTH1 | LEVEL1 | 1 1 0 0 |
| 1 1 | VTH0 | LEVEL0 | 1 1 1 0 |

APPARATUS FOR PROGRAMMING THRESHOLD VOLTAGE FOR NON-VOLATILE MEMORY CELL AND METHOD THEREFOR

BACKGROUND OF THE INVENTION

1. Field of the Invention

The present invention relates to an apparatus for programming threshold voltage of a non-volatile memory cell and a method therefor, and more particularly to an apparatus for programming threshold voltage of a non-volatile memory cell by which a threshold voltage of a memory cell to be programmed is precisely controlled by a voltage of a word line so as to program a plurality of threshold voltages in a constant range of the threshold voltage, the programming time can be reduced by an automatic reference programming method, and consumption power in programming can be also reduced, and a method therefor.

2. Description of the Conventional Art

General methods for programming a threshold voltage of a non-volatile memory cell refer to a technique that a program voltage pulse is applied for a predetermined time and then the programmed state of the threshold voltage of the memory cell is inspected. In this method, a distribution of the threshold voltage is determined by the time interval during which program pulses are applied, and the programming time is determined by the time during which the programming and inspecting are repeatedly done.

Thus, in order to prevent the repetition of reference to the program, an automatic reference programming method was proposed, which, however, is merely applicable to single-level programs, failing defining definitive relation between the threshold voltage of the memory cell to be programmed and a reference current or reference voltage determining the termination of the program.

FIG. 1 is a circuit diagram of an apparatus for programming a threshold voltage of a flash memory cell out of non-volatile memory cells adapting a conventional automatic reference programming method. As shown in this drawing, the apparatus for programming the threshold voltage of a flash memory cell includes a cell array 1 having a plurality of flash memory cell consisting of a floating gate, a gate thereof being connected to a word line, a drain thereof being connected to a bit line, and a source thereof being connected to a ground voltage VSS; a switching unit 2 for selectively transmitting a program voltage VPRO according to a control signal PROC; a bit line selector 3 for selectively connecting the program voltage VPRO transmitted from the switching unit 2 to the bit line according to a first to Mth bit line selecting signals; a word line selector 4 for selecting a specific word line according to a first to Nth word line select signals; a resistor 5 for converting a cell current ICELL flowing at the bit line to a voltage; a comparator 6 for outputting a result SOUT upon comparison of the converted voltage by the resistor 5 to a reference voltage VREF; and a controller 7 for receiving a state data SD and outputting a program control signal PROC for controlling a program process according to the output of the comparator 6 to the switching unit 2.

The operation of the conventional apparatus for programming the threshold voltage of flash memory cell constructed as described above will now be explained.

First, the word line selector 4 selects a word line connected to a memory cell desired to be programmed according to the first to Nth word line select signals WLS0-WLS(N-1), and applies a predetermined voltage to the selected word line.

At this time, the bit line selector 3 selects a bit line connected to the memory cell desired to be programmed according to the first to Mth bit line select signals BLS0-BLS(M-1).

Accordingly, the memory cell selected by the bit line selector 3 and the word line selector 4 is processed to be programmed.

During the programming, the controller 7 outputs a program control signal PROC to the switching unit 2, and the switching unit 2 applies the program voltage VPRO to the selected bit line of the bit line selector 3 according to the program control signal PROC.

Accordingly, the program voltage VPRO is applied to the memory cell connected to the selected bit line and the word line, to thereby program the memory cell. At this time, a threshold voltage of the memory cell being programmed is increased, so that a cell current ICELL flowing at the bit line connected to the pertinent memory cell is decreased.

In the meantime, the resistor 5 converts the cell current ICELL flowing at the bit line of the selected memory cell to a voltage and applies it to the comparator 6. Then, the comparator 6 compares the voltage converted by the resistor 5 with the initially predetermined reference voltage VREF and outputs its result to the controller 7.

In order to end the program by the output SOUT of the comparator 6 at a specific time when the voltage converted by the resistor 50 becomes greater than the reference voltage VREF, the controller 7 outputs the program control signal PROC to the switching unit 2 so as to block the program voltage VPRO.

However, the conventional apparatus for programming the threshold voltage of the flash memory cell has disadvantages in that if the threshold voltage of the memory cell is initially dropped down, and thus, the current overflows, the cell current ICELL flowing at the bit line drops down, causing the programming speed to be reduced. In addition, after the programming is finished, since the relation between the threshold voltage of the programmed cell and the reference voltage is indistinct, the threshold voltage is to be determined relying on experience bases.

SUMMARY OF THE INVENTION

Accordingly, an object of the present invention is to provide an apparatus for programming a threshold voltage of a non-volatile memory cell in which a threshold voltage of a memory cell is precisely controlled by a word line voltage, its programming time is reduced by using an automatic reference programming method, and the programming can be performed with a low power supply, and a method therefor.

To achieve these and other advantages and in accordance with the purpose of the present invention, as embodied and broadly described herein, there is provided an apparatus for programming a threshold voltage of a non-volatile memory cell including: a reference voltage generator applying a predetermined voltage to a word line of a reference memory cell having the same electrical characteristics as the non-volatile memory cell desired to be programmed and generating a reference voltage according to the thusly generated current; a word line voltage generator outputting a single word line voltage corresponding to a level count value among the word line voltages that correspond one-to-one to a plurality of threshold voltages; a word line selector applying a word line voltage outputted from the word line voltage generator to a word line selected by a word line enable signal; a level data selector encoding a state data and outputting a data corresponding to each level according to level select signals; a latch latching a signal outputted from the level data selector; a bit line voltage controller selectively applying a program voltage to the bit line according to the state of the data latched by the latch; a comparator converting a current flowing at the bit line to a voltage and outputting a compared result upon comparing the voltage with the reference voltage; a bit line selector selecting a specific bit line according to a bit line enable signal; and a memory cell array having a plurality of memory cells that are selected by the word line and the bit line and are electrically programmed.

Also, there is provided a method for programming a threshold voltage of a non-volatile memory cell including the steps of: initializing a level count value; applying a word line voltage corresponding to the level count value to a selected word line; encoding a state data; storing a data corresponding to a current level at a latch according to the encoded state data; simultaneously programming and referencing the memory cell selected by a word line and a bit line; determining whether the data stored at the latch is set; determining whether the level count value is of maximum value if the data stored at the latch is set; ending the program if the level count value is the maximum value; and returning to the second step by increasing the level count value if the level count value is not the maximum value.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
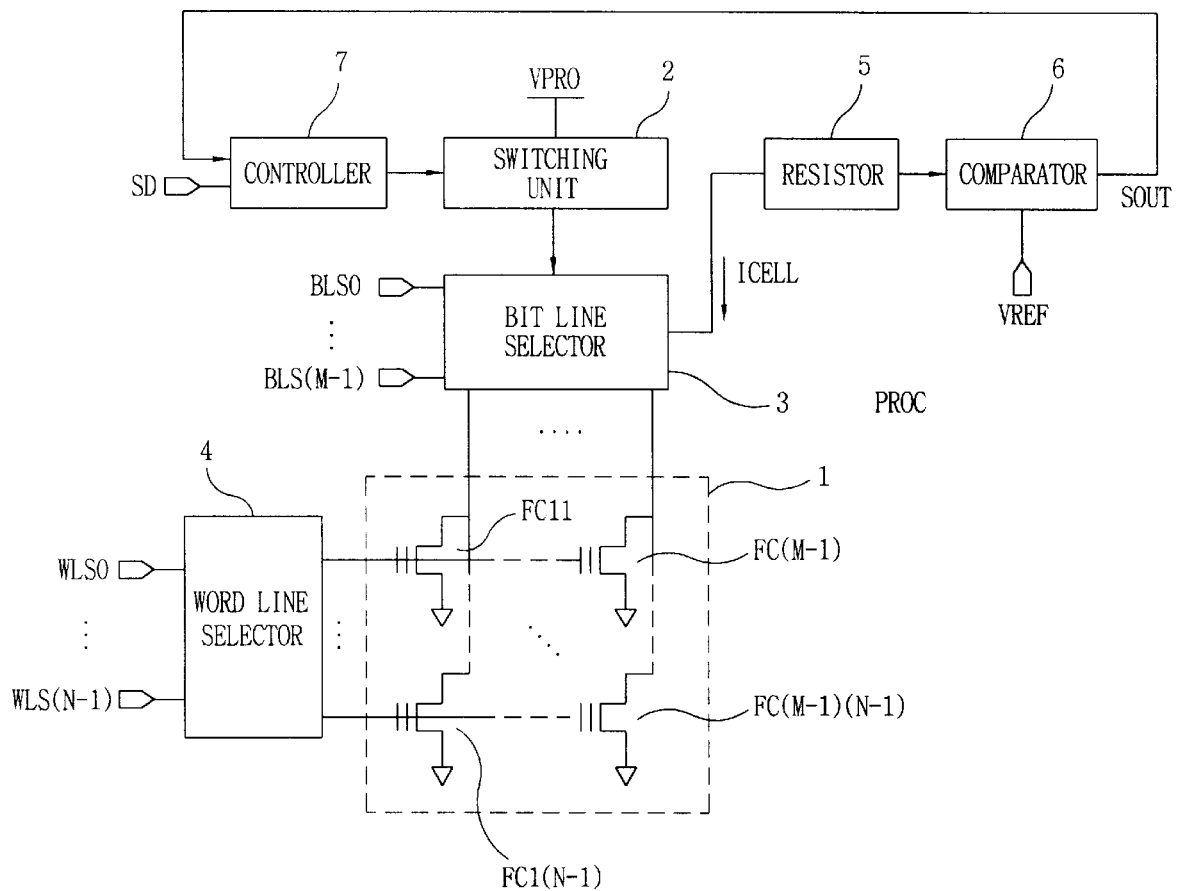
FIG. 1 is a schematic circuit diagram of a conventional apparatus for programming a threshold voltage of a flesh memory cell adapting an automatic reference programming method.
Figure 2:
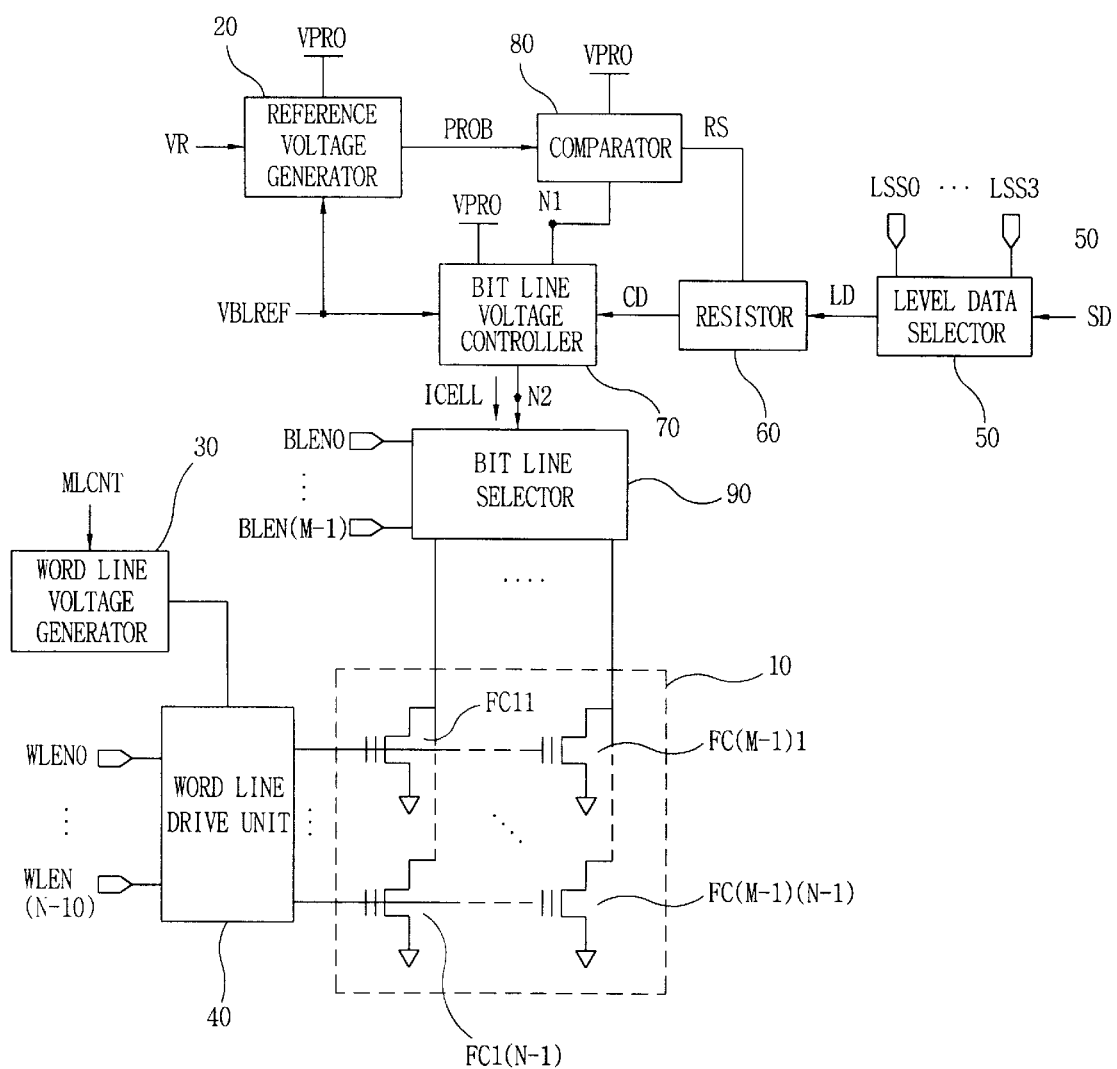
FIG. 2 is a schematic block diagram of an apparatus for programming a threshold voltage of a flash memory cell in accordance with the present invention.

FIG. 2 is a schematic block diagram of an apparatus for programming a threshold voltage of a flash memory cell of non-volatile memory cells. Here, the apparatus constructed as shown is for programming four levels (2 bit memory cell).

As shown in this drawing, the apparatus for programming a threshold voltage of a selected memory cell from a memory cell array 10 that are selected by the word line and the bit line and are electrically programmed, having a floating gate, includes a reference voltage generator 20 applying a predetermined voltage to a word line of a reference memory cell having the same electrical characteristics as the non-volatile memory cell desired to be programmed and generating a reference voltage according to the thusly generated current; a word line voltage generator 30 outputting a single word line voltage corresponding to a level count value among the word line voltages that correspond one-to-one to a plurality of threshold voltage; a word line drive unit 40 for applying the word line voltage outputted from the word line voltage generator 30 to a word line selected by a first to Nth word line enable signals WLENO-WLN(N−1); a level data selector 50 encoding a state data and outputting a data corresponding to each level according to level select signals; a latch 60 latching a signal outputted from the level data selector; a bit line voltage controller 70 selectively applying a program voltage to the bit line according to the state of the data latched by the latch; a comparator 80 converting a current flowing at the bit line to a voltage and outputting a compared result upon comparing the voltage with the reference voltage; a bit line selector 90 selecting a specific bit line according to a first to Mth bit line enable signals BLENO-BLEN(M−1).

Figure 3:
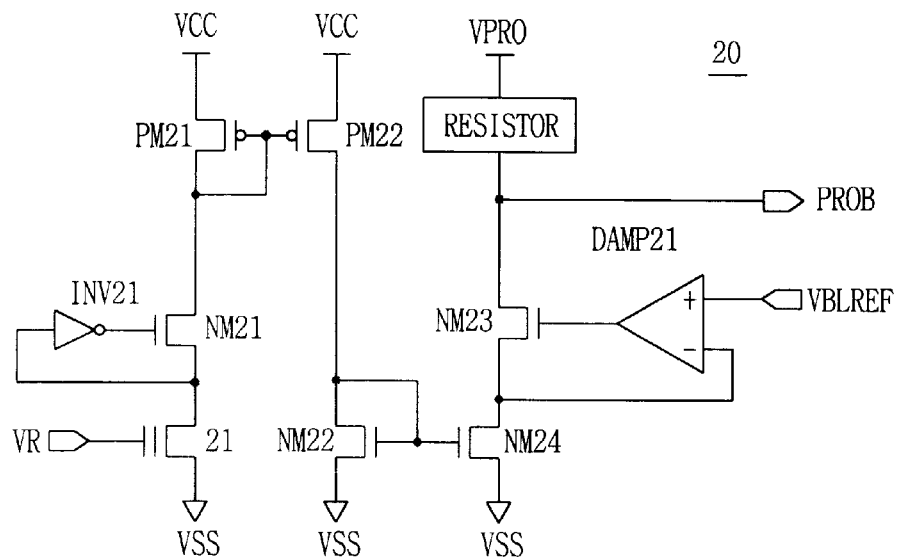
FIG. 3 is a detailed schematic circuit diagram of a reference voltage generator of FIG. 2.

FIG. 3 is a detailed schematic circuit diagram of the reference voltage generator 20 includes first PMOS transistor PM21 connected in series between a power supply voltage VCC and a ground voltage VSS, having a gate and a drain commonly connected; first NMOS transistor NM21, a voltage of a source thereof being inverted by a first inverter INV21 to be applied to a gate thereof; a reference memory cell 21 having a floating gate, a predetermined voltage VR being applied to a gate thereof; a second PMOS transistor PM22 being connected in series between the power supply voltage VCC and the ground voltage VSS, a gate thereof being commonly connected to the gate of the first PMOS transistor PM1; second NMOS transistor NM22 having a drain and a gate commonly connected; a resistor 22 being connected in series between a program voltage VPRO and a ground voltage VSS, the program voltage VPRO being applied to one terminal thereof; third NMOS transistor NM23, a drain thereof being connected to the other terminal of the resistor 22; fourth NMOS transistor NM24, a gate thereof being commonly connected to the gate of the second NMOS transistor NM22; a differential amplifier DAMP21 for applying a voltage at the source of the third NMOS transistor NM23, the source being commonly connected to the drain of the fourth NMOS transistor NM24, to an inversion terminal(−), applying a reference bit line voltage VBLREF to a non-inversion terminal (+), and applying the comparing result to the gate of the third NMOS transistor NM23, to thereby output a reference voltage PROB from the other terminal of the commonly connected resistor 22 and from the drain of the third NMOS transistor NM23.

Figure 4:
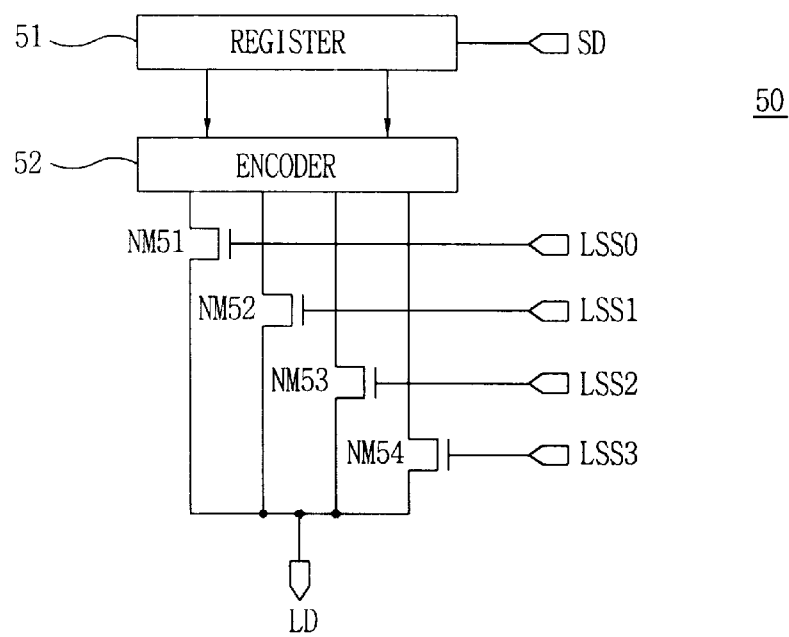
FIG. 4 is a detailed schematic circuit diagram of a level data selector of FIG. 2.

FIG. 4 is a detailed schematic circuit diagram of the level data selector 50 which includes a register 51 temporarily storing 2 bit of state data SD; an encoder 52 encoding an output signal from the register 51; and first to fourth NMOS transistors NM51–NM54 each selectively outputting the output signal from the encoder 52 to the latch 60 under the control of first to fourth level select signals LSS0–LSS3.

Figures 5, 6:
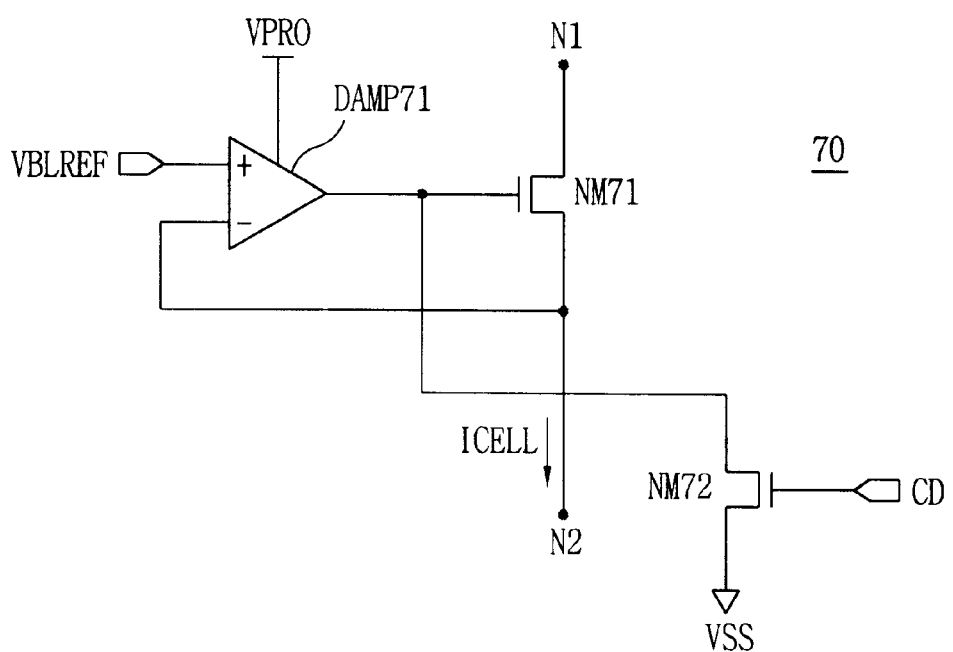
FIG. 5 is a table showing an example of output data according to 2 bit of state data of FIG. 4.
FIG. 6 is a detailed schematic circuit diagram of a bit line voltage controller of FIG. 2.

FIG. 6 is a schematic circuit diagram of the bit line voltage controller 70, which includes first NMOS transistor NM71, a drain thereof being connected to a first node N1, a source thereof being connected to a second node N2; a differential amplifier DAMP71 being driven by the program voltage VPRO to apply the reference bit line voltage VBL-REF to the non-inversion terminal (+) and the voltage of the second node N102 to the inversion terminal (−), comparing them and applying the comparing result to the gate of the first NMOS transistor NM71; and second NMOS transistor NM72 having a drain to which the output from the differential amplifier DAMP71 is applied, a source being connected to the ground voltage VSS and a gate to which the output from the latch 60 is applied.

Figure 8:
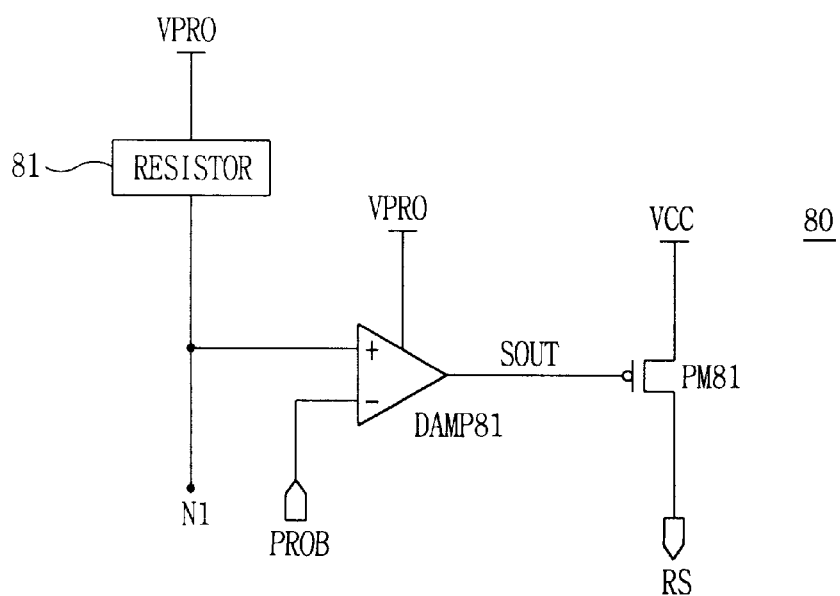
FIG. 8 is a detailed schematic circuit diagram of a comparator of FIG. 2.

FIG. 8 is a schematic circuit diagram of the comparator 80 which includes a resistor 81, the program voltage VPRO being applied to one terminal thereof, the other terminal being connected to the first node N1; a differential amplifier DAMP81 being driven by the program voltage VPRO, applying the voltage of the first node N1 to the non-inversion terminal (+) and the reference voltage PROB to the inversion terminal (−), and outputting a comparing result SOUT; and first PMOS transistor PM81 having a source to which the power supply voltage VCC is applied and a gate to which the output signal from the differential amplifier is applied, thereby selectively applying the power supply voltage VCC to the latch 60.

The operation of the apparatus for programming the threshold voltage of the non-volatile memory cell of the present invention constructed as described above will now be explained.

First, the word line voltage generator 30 outputs the lowest word line voltage among four word line voltages corresponding to four threshold voltages of the memory cell connected to a selected word line. That is, after initializing a level count value MLCNT which counts a level step for programming, it outputs a corresponding word line voltage to the word line drive unit 40.

The memory cell selected by the bit line selected by the bit line selector 90 and the word line selected by the word line drive unit 40 is processed to be programmed by the lowest word line voltage.

Figure 7:
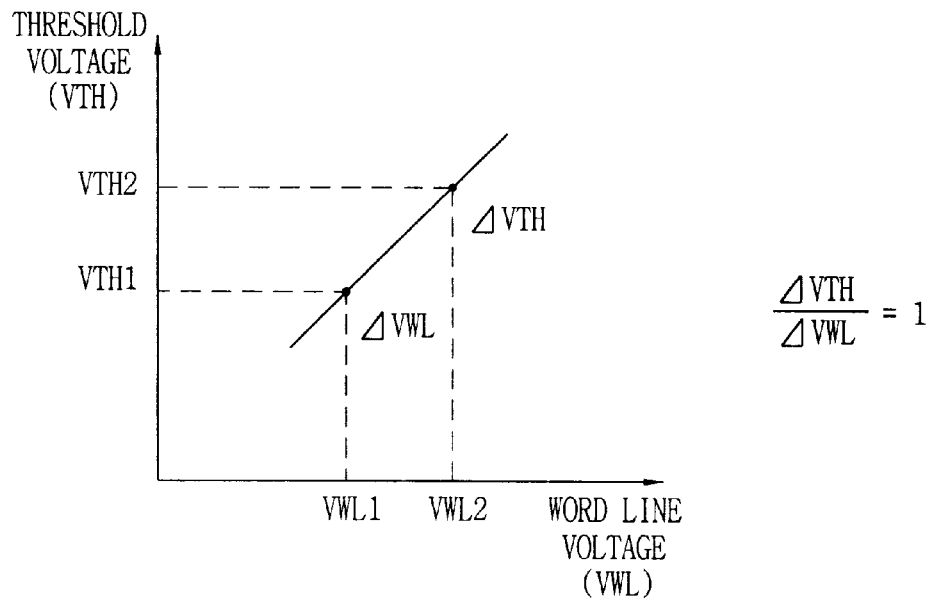
FIG. 7 is a graph showing relationship between a word line voltage and a threshold voltage of FIG. 2.

Here, as shown in FIG. 7, the voltage difference between each word line occurring at the word line voltage generator 30 has the same difference as that between each threshold voltage of the memory cell being programmed. The reason is because the threshold voltage of the programmed memory cell increases ΔVTH as much ΔVWL as the word line voltage increases.

At this time, the reference voltage generator 20 converts the current flowing at the reference memory cell 21 due to the predetermined voltage VR to the reference voltage PROB and outputs it by using the current mirror and the differential amplifier. The reference memory cell 21 is a flash memory cell having the same electrical characteristics as the program-subjected memory cell.

The level data selector 50 receives the 2 bit of state data SD, which is encoded by an encoder 52, and the encoded result is converted to a data corresponding to each level by the first through fourth level select signals (LSS0–LSS3) and then is outputted to the latch 60. FIG. 5 is a table showing four word line voltages and each corresponding state data SD. The cell of which the state data SD is '00' refers to the fourth level with the highest threshold voltage for which programming is carried out four times, while the cell of which data SD is '11' refers to first level with the lowest threshold voltage for which programming is carried out once.

The latch 60 receives the data LD corresponding to each level from the level data selector 50 under the control of the output signal RS from the comparator 80 and latches them.

Assuming that the selected memory is set to be a data to perform programming if the data LD stored at the latch 60 is '0', while it is set to be a data to stop programming if the data stored at the latch 60 is '1', when the output signal CD from the latch 60 is '0', the bit line voltage controller 70 applies a sufficient program voltage VPRO for programming to the bit line. Inversely, when the output signal CD from the latch 60 is '1', the bit line voltage controller 70 blocks the program voltage VPRO to be applied to the bit line.

The bit line selector 90 selects a bit line by the first through Mth bit line enable signals BEN0-BEN(M−1) to output the program voltage VPRO to the selected memory cell.

Accordingly, the memory cell of the memory cell array is selected by the bit line selector 90 and the word line selector 40 and then is programmed by the word line voltage ourputted from the word line voltage generator 30.

Meanwhile, while the selected memory cell is programmed, the threshold voltage of the memory cell moves and the current of the cell ICELL is reduced. At this time, the comparator 80 compares the reference voltage PROB of the reference voltage generator 20 with the bit line voltage generated by the cell current ICELL, and at the state that the programming is being carried out, if the bit line voltage has a lower level than the reference voltage PROB, the latch 60 applies '1' to the bit line voltage controller 70 according to the comparison. Accordingly, the second NMOS transistor NM72 of the bit line voltage controller 70 is turned on and the first NMOS transistor NM71 is turned off, so that applying of the program voltage VPRO to the bit line is blocked, thereby discontinuing programming.

Subsequently, the above operations are repeated as increasing the level count value MLCNT. In the present invention, 4 level of programs are proposed, thus, the maximum value of the level count value MLCNT is '4'. This signifies the programming is stopped when the level count value MLCNT is of the maximum value of '4' when the above described operations are repeated as the level count value MLCNT increases.

Figure 9:
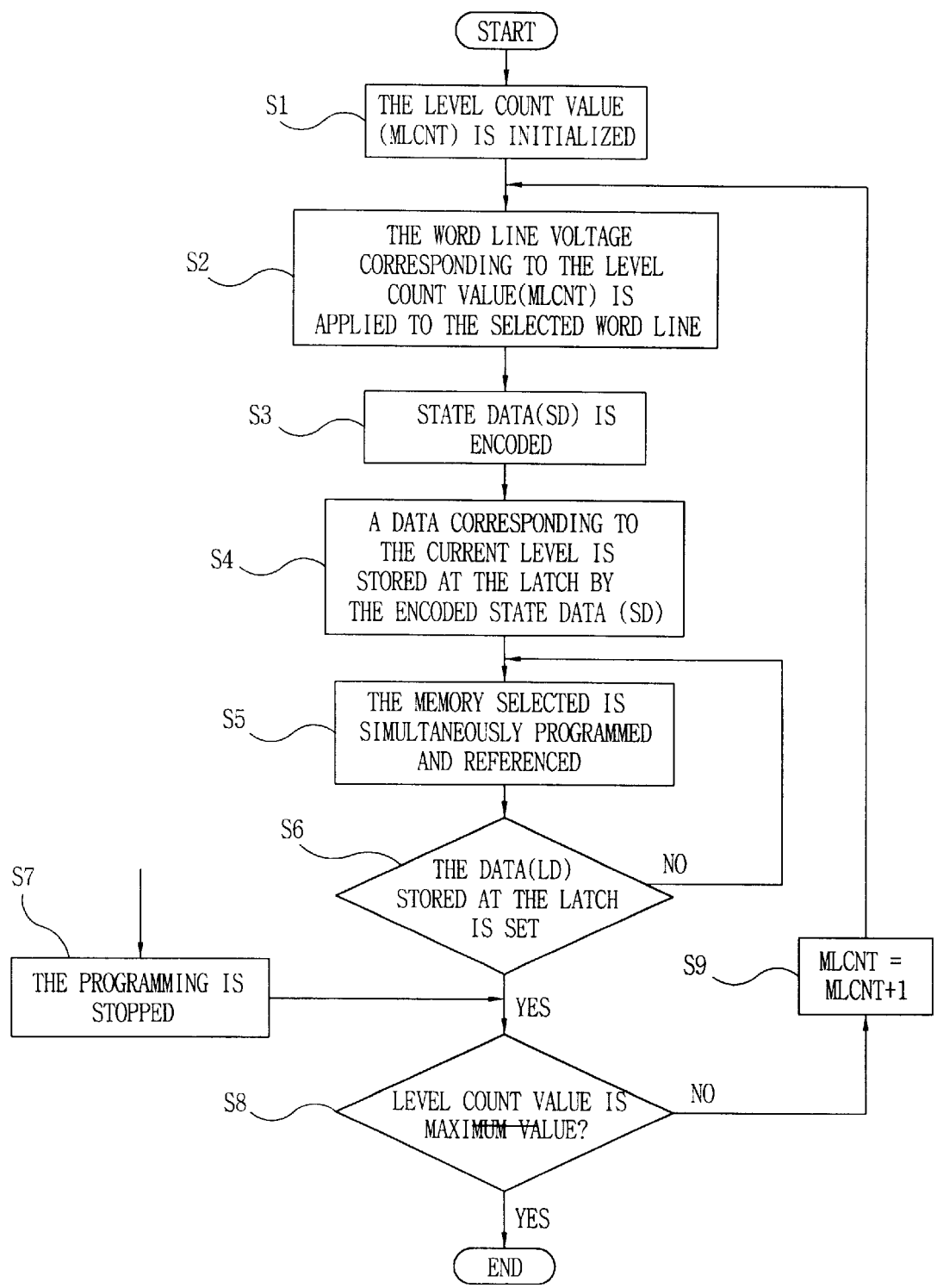
FIG. 9 is flow chart of operational order of FIG. 2.

The method for programming the threshold voltage of the selected flash memory cell according to the apparatus for programming the threshold voltage of the flash memory cell of the present invention constructed as above described will now be explained with reference to the flow chart of FIG. 9.

First, the level count value MLCNT is initialized in first step S1. That is, the lowest word line voltage is selected among the four word line voltages corresponding to the four threshold voltage in a selected memory cell.

The word line voltage corresponding to the level count value MLCNT is applied to the selected word line in second step S2.

A state data SD is encoded in third step S3.

A data corresponding to the current level is stored at the latch 60 by the encoded state data SD in fourth step S4.

The memory selected by the word line and the bit line is simultaneously programmed and referenced by the word line voltage corresponding to the level count value MLCNT in fifth step S5.

Subsequently, it is judged whether the data LD stored at the latch 60 is set in sixth step S6, and if the data LD is not set, the selected memory cell is processed to be kept programming in fifth step S5.

Otherwise, if the stored data is set, the programming at the current level is stopped in seventh step S7, and it is discriminated whether the level count value MLCNT is maximum value in eighth step S8. Here, the maximum value is 4 with the 4 level memory cell.

At this time, if the level count value MLCNT is of the maximum value, the programming is ended in the seventh step S7.

Otherwise, if the level count value MLCNT is not the maximum value, the level count value MLCNT is increased by '1'.

Subsequently, the word line voltage corresponding to the increased level count value MLCNT is applied to the selected word line in the second step S2, and the current state data SD is encoded in the third step S3. And the data LD corresponding to the current level is stored at the latch 60 by the encoded state data SD, and thusly selected memory cell is programmed by the word line voltage corresponding to the increased level count value MLCNT.

As so far described, according to the apparatus and method for programming the threshold voltage of the non-volatile memory cell of the present invention, the threshold voltage of the program-objected memory cell can be controlled precisely, and the programming time can be reduced by using the automatic reference programming method. In addition, the programming is carried out with a low power supply.

It will be apparent to those skilled in the art that various modifications and variations can be made in the present invention without departing from the spirit or scope of the invention. Thus, it is intended that the present invention cover such modifications and variations provided they come within the scope of the appended claims and their equivalents.

What is claimed is:

1. An apparatus for programming a threshold voltage of a non-volatile memory cell comprising:

a reference voltage generator means applying a predetermined voltage to a word line of a reference memory cell having the same electric characteristics as the memory cell desired to be programmed and generating a reference voltage by thusly generated current;

a comparator means comparing the reference voltage with a bit line voltage according to the cell current flowing at the memory cell to be programmed;

a word line voltage generator means being controlled by a level count value, selecting word line voltages corresponding to the plurality of threshold voltages of the memory cell to be programmed and outputting it;

a word line driving means applying the word line voltages selected by the word line voltage generator means to the word line selected by the word line enable signal;

a level data selector means encoding a state data and selectively outputting data corresponding to each level by the level select signal;

a latch means being controlled by the output signal from the comparator, latching the data outputted from the level data selector means;

a bit line voltage controller means selectively discontinuing programming according to the level of the data latched by the latch means; and a bit line selector means selecting a specific bit line by a bit line enable signal.

2. The apparatus according to claim 1, wherein the reference voltage generator includes:

first PMOS transistor connected in series between a power supply voltage VCC and a ground voltage VSS, having a gate and a drain commonly connected;

first NMOS transistor, a voltage of a source thereof being inverted by a first inverter to be applied to a gate thereof;

a reference memory cell having a floating gate, a predetermined voltage being applied to a gate thereof;

a second PMOS transistor being connected in series between the power supply voltage and the ground voltage, a gate thereof being commonly connected to the gate of the first PMOS transistor;

second NMOS transistor having a drain and a gate commonly connected;

a resistor being connected in series between a program voltage and a ground voltage, the program voltage being applied to one terminal thereof;

third NMOS transistor, a drain thereof being connected to the other terminal of the resistor;

fourth NMOS transistor, a gate thereof being commonly connected to the gate of the second NMOS transistor;

a comparator for applying a voltage at the source of the third NMOS transistor, the source being commonly connected to the drain of the fourth NMOS transistor, to an inversion terminal(−), applying a reference bit line voltage to a non-inversion terminal (+), and applying the comparing result to the gate of the third NMOS transistor, to thereby output a reference voltage from the other terminal of the commonly connected resistor and from the drain of the third NMOS transistor.

3. The apparatus according to claim 2, wherein the reference memory cell has the same electric characteristics as the memory cell to be programmed.

4. The apparatus according to claim 2, wherein the comparator includes a differential amplifier.

5. The apparatus according to claim 1, wherein the level data selector includes:

a register temporarily storing 2 bit of state data;

an encoder encoding an output signal from the register; and first to fourth NMOS transistors each selectively outputting the output signal from the encoder to the latch under the control of first to fourth level select signals.

6. The apparatus according to claim 1, wherein the bit line voltage controller includes:

first NMOS transistor a drain thereof being connected to a first node, a source thereof being connected to a second node;

a differential amplifier being driven by the program voltage to apply the reference bit line voltage to the non-inversion terminal (+) and the voltage of the second node to the inversion terminal (−), comparing them and applying the comparing result to the gate of the first NMOS transistor; and second NMOS transistor having a drain to which the output from the differential amplifier is applied, a source being connected to the ground voltage and a gate to which the output from the latch is applied.

7. The apparatus according to claim 6, wherein the comparator includes a differential amplifier.

8. The apparatus according to claim 1, wherein the comparator includes:

a resistor, the program voltage VPRO being applied to one terminal thereof, the other terminal being connected to the first node;

a differential amplifier being driven by the program voltage, applying the voltage of the first node to the non-inversion terminal (+) and the reference voltage to the inversion terminal (−), and outputting a comparing result; and first PMOS transistor having a source to which the power supply voltage is applied and a gate to which the output signal from the differential amplifier is applied to thereby selectively apply the power supply voltage to the latch.

9. The apparatus according to claim 8, wherein the comparator includes a differential amplifier.

10. The apparatus according to claim 1, wherein the word line voltage generator means outputs a single word line voltage of the plurality of word line voltages corresponding to the plurality of threshold voltages of the selected memory cell.

11. The apparatus according to claim 1, wherein the word line generator means is controlled by the level count value.

12. The apparatus according to claim 11, wherein the level count value is the value counted to the level number of the memory cell to be programmed.

13. The apparatus according to claim 1, wherein the variation value between each word line voltage outputted from the word line voltage generator means is identical to the variation value between each threshold voltage of the memory cell to be programmed.

14. The apparatus according to claim 1, wherein the level data selector means encodes a state data and outputs a data corresponding to each level thereof.

15. The apparatus according to claim 1, wherein the bit line voltage controller means selectively applies the program voltage to the bit line through the bit line selector means according to the state of the data outputted from the latch means.

16. The apparatus according to claim 1, wherein the comparator compares the reference voltage of the reference voltage generator means with the bit line voltage of the programmed memory cell, and carries out the programming if the bit line voltage is higher, and enables the voltage controller means to block the bit line voltage to be applied to the bit line by the latch means if the bit line voltage is lower.

17. A method for programming a threshold voltage of a non-volatile memory cell including the steps of:

initializing a level count value;

applying a word line voltage corresponding to the level count value to a selected word line;

encoding a state data;

storing a data corresponding to the current level at a latch means by the encoded state data;

simultaneously programming and referencing the memory cell selected by the word line and the bit line;

judging whether the data stored at the latch means is set;

judging whether the level count value is the maximum value if the data stored at the latch means has set;

terminating the programming if the level count value is the maximum value; and increasing the level count value to be fedback to the second step if the level count value is not the maximum value.

18. The method according to claim 17, wherein the maximum value of the level count value refers to the level number of the threshold voltage of the non-volatile memory cell desired to be programmed.

19. The method according to claim 17, wherein the data stored at the latch means in the sixth step further includes a step for feeding back to the fifth step if the data stored at the latch has not set.

* * * * *